United States Patent
Okamoto

(10) Patent No.: US 8,873,266 B2
(45) Date of Patent: Oct. 28, 2014

(54) NONVOLATILE SEMICONDUCTOR MEMORY DEVICE AND METHOD FOR MANUFACTURING THE SAME

(75) Inventor: Tatsuya Okamoto, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 253 days.

(21) Appl. No.: 13/399,195

(22) Filed: Feb. 17, 2012

(65) Prior Publication Data

US 2012/0236652 A1    Sep. 20, 2012

(30) Foreign Application Priority Data

Feb. 18, 2011  (JP) ................. 2011-033004

(51) Int. Cl.
*G11C 7/02*      (2006.01)
*H01L 29/788*    (2006.01)
*H01L 21/765*    (2006.01)
*H01L 27/115*    (2006.01)
*H01L 29/423*    (2006.01)

(52) U.S. Cl.
CPC ............ *H01L 29/7881* (2013.01); *G11C 7/02* (2013.01); *H01L 21/765* (2013.01); *H01L 27/11521* (2013.01); *H01L 29/42336* (2013.01)
USPC ......................... 365/53; 365/185.17

(58) Field of Classification Search
CPC ....................................................... G11C 7/02
USPC ..................................... 365/53, 185.17, 185.18
See application file for complete search history.

(56) References Cited

U.S. PATENT DOCUMENTS

| | | | | |
|---|---|---|---|---|
| 4,185,319 | A | * | 1/1980 | Stewart ................ 365/185.01 |
| 2006/0028867 | A1 | * | 2/2006 | Forbes et al. ........... 365/185.05 |
| 2008/0003745 | A1 | | 1/2008 | Myung et al. |
| 2009/0283821 | A1 | | 11/2009 | Nakao |

FOREIGN PATENT DOCUMENTS

| | | |
|---|---|---|
| JP | 2005-286155 | 10/2005 |
| JP | 2009-283488 | 12/2009 |

* cited by examiner

*Primary Examiner* — Vu Le
(74) *Attorney, Agent, or Firm* — Oblon, Spivak, McClelland, Maier & Neustadt, L.L.P.

(57) ABSTRACT

According to one embodiment, a nonvolatile semiconductor memory device includes a first memory string including a first memory cell and a second memory cell aligned along a first axis, a source contact provided at a source-side end of the first memory string, a second memory string that extends along the first axis and includes a third memory cell that aligns with the first memory cell along a second axis perpendicular to the first axis, and a shield conductive layer. The shield conductive layer extends along the first axis between the first memory string and the second memory string and is electrically connected to the source contact.

19 Claims, 8 Drawing Sheets

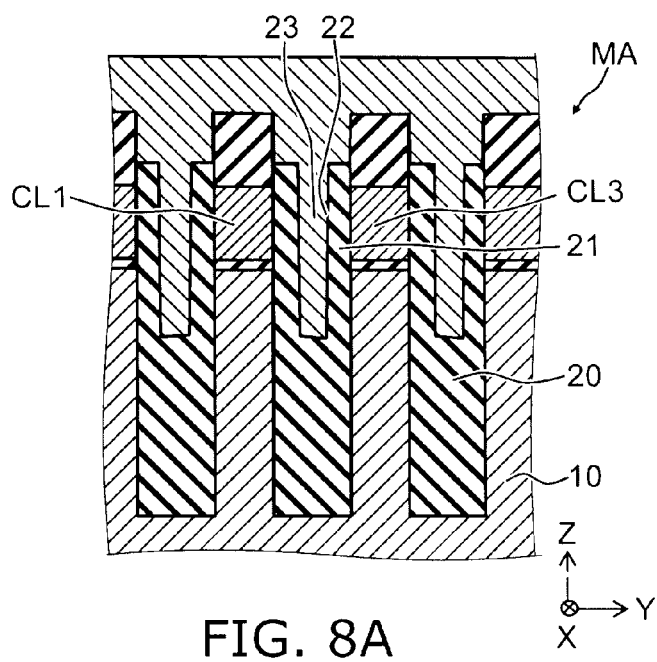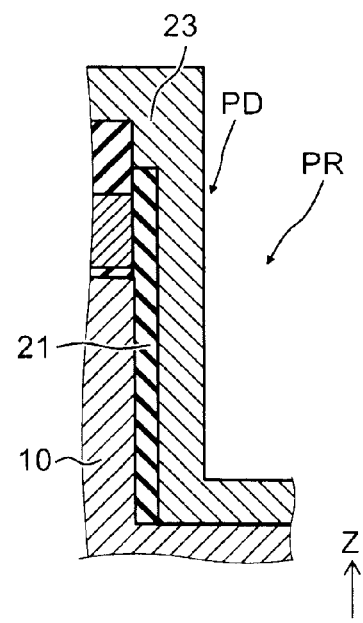
FIG. 8A    FIG. 8B
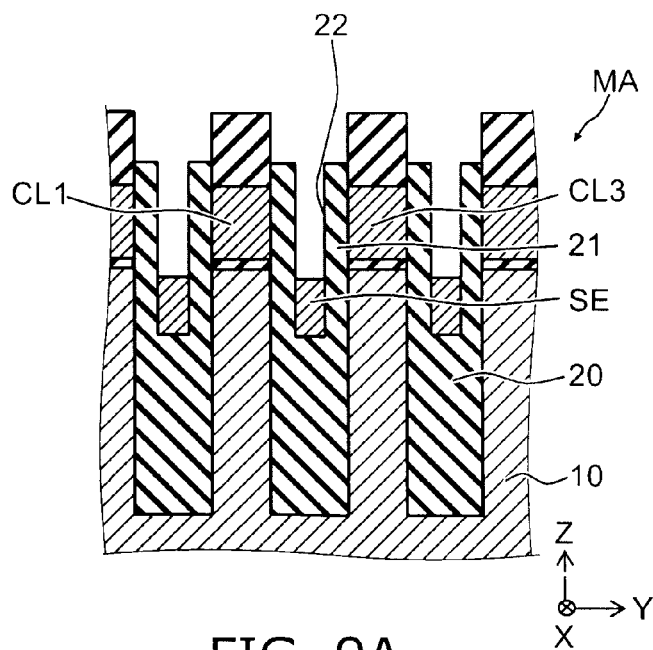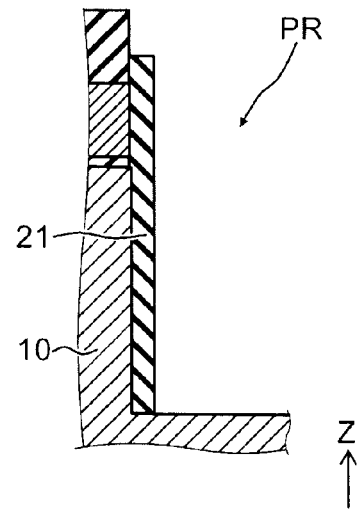
FIG. 9A    FIG. 9B

US 8,873,266 B2

NONVOLATILE SEMICONDUCTOR MEMORY DEVICE AND METHOD FOR MANUFACTURING THE SAME

CROSS-REFERENCE TO RELATED APPLICATIONS

This application is based upon and claims the benefit of priority from the prior Japanese Patent Application No. 2011-033004, filed on Feb. 18, 2011; the entire contents of which are incorporated herein by reference.

FIELD

Embodiments described herein relate generally to a nonvolatile semiconductor memory device and a method for manufacturing the same.

BACKGROUND

For example, in nonvolatile semiconductor memory devices such as nonvolatile semiconductor memory devices having charge storage layer, progress is being made in increasing the level of integration and decreasing the size of memory cells. As the distance between adjacent cells is reduced, interference between adjacent cells becomes more apparent. Specifically, capacitive coupling increases, and data written to a charge storage layer is sometimes mistakenly read as a value different to a desired value due to effects of adjacent cells.

BRIEF DESCRIPTION OF THE DRAWINGS

FIG. 8A and FIG. 8B are procedural schematic cross-sectional views illustrating the manufacturing method of the nonvolatile semiconductor memory device according to the second embodiment;

FIG. 9A and FIG. 9B are procedural schematic cross-sectional views illustrating the manufacturing method of the nonvolatile semiconductor memory device according to the second embodiment.

DETAILED DESCRIPTION

Figure 1:
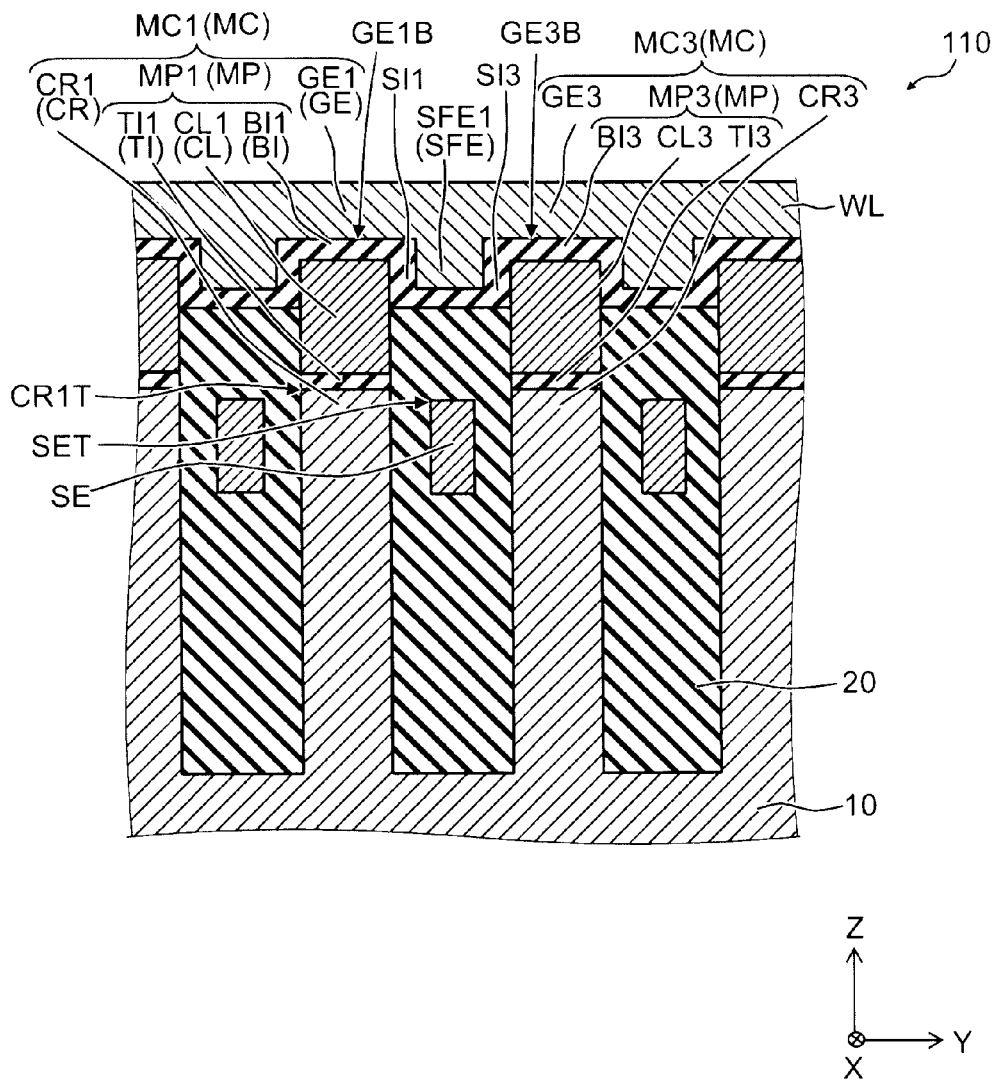
FIG. 1 is a schematic cross-sectional view illustrating a configuration of a nonvolatile semiconductor memory device according to a first embodiment.

In general, according to one embodiment, a nonvolatile semiconductor memory device includes a first memory string including a first memory cell and a second memory cell aligned along a first axis, a first source contact provided at a source-side end of the first memory string, a second memory string that extends along the first axis and includes a third memory cell that aligns with the first memory cell along a second axis perpendicular to the first axis, and a shield conductive layer. The shield conductive layer extends along the first axis between the first memory string and the second memory string and is electrically connected to the first source contact.

In general, according to another embodiment, a manufacturing method for a nonvolatile semiconductor memory device having a memory cell array portion including a first memory string that includes a first memory cell and a second memory cell aligned along a first axis, a source contact provided at a source-side end of the first memory string, a second memory string that includes a third memory cell aligned with the first memory cell along a second axis perpendicular to the first axis and that extends along the first axis, and a shield conductive layer that extends along the first axis between the first memory string and the second memory string and is electrically connected to the source contact; and a peripheral portion including a recess portion that is aligned with the memory cell array portion and has a width greater than a width of a gap between the first memory cell and the third memory cell is provided. The method includes: forming, on a substrate, a first charge storage layer that is to form a portion of the first memory cell, a third charge storage layer that is to form a portion of the third memory cell and an intercell insulation layer between the first charge storage layer and the third charge storage layer; forming a trench in the intercell insulation layer; forming a conductive film within the trench and in the recess portion; removing the conductive film formed in the recess portion while leaving a portion of the conductive film formed within the trench; and covering the portion of the conductive film left within the trench using an insulating layer.

Embodiments are described hereinafter while referring to the drawings.

Note that the drawings are schematic or simplified illustrations and that relationships between thicknesses and widths of parts and proportions in size between parts may differ from actual parts. Also, even where identical parts are depicted, mutual dimensions and proportions may be illustrated differently depending on the drawing.

Note that in the drawings and specification of this application, the same numerals are applied to constituents that have already appeared in the drawings and been described, and repetitious detailed descriptions of such constituents are omitted.

First Embodiment

FIG. 1 is a schematic cross-sectional view illustrating a configuration of a nonvolatile semiconductor memory device according to the first embodiment.

Figure 2:
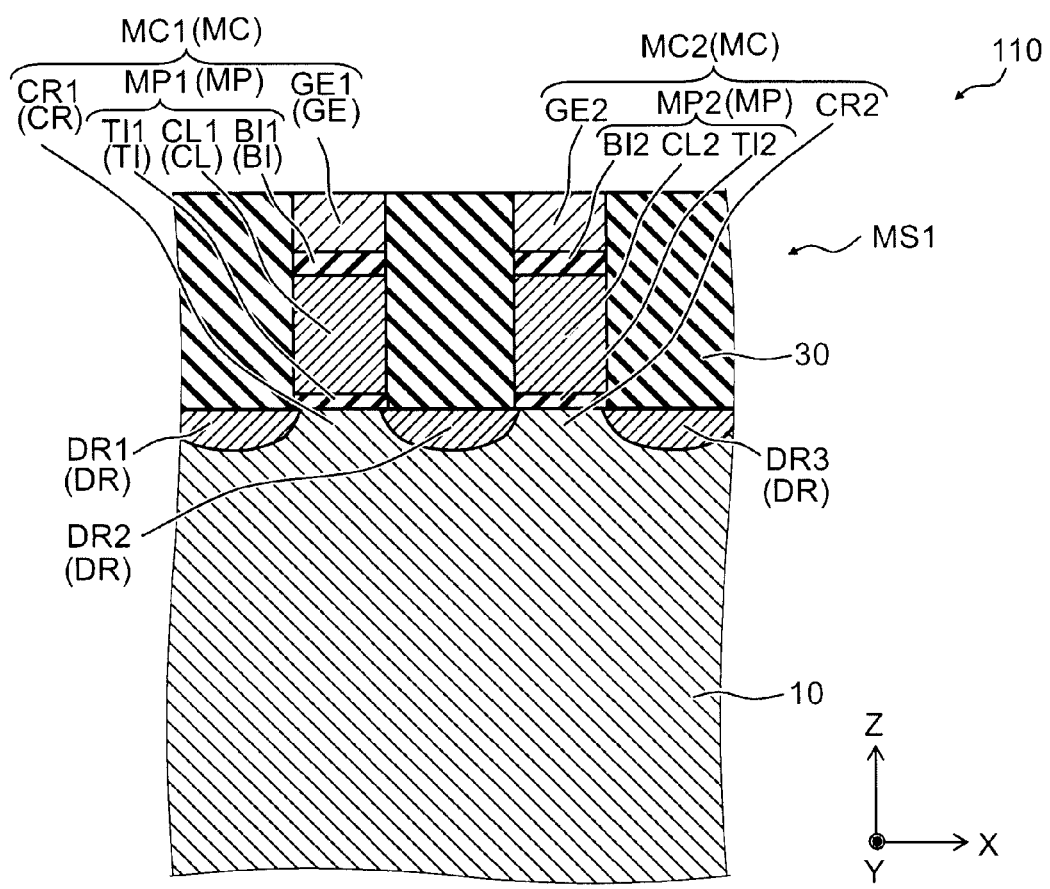
FIG. 2 is a schematic cross-sectional view illustrating a configuration of the nonvolatile semiconductor memory device according to the first embodiment.

FIG. 2 is a schematic cross-sectional view illustrating a configuration of the nonvolatile semiconductor memory device according to the first embodiment.

Figure 3:
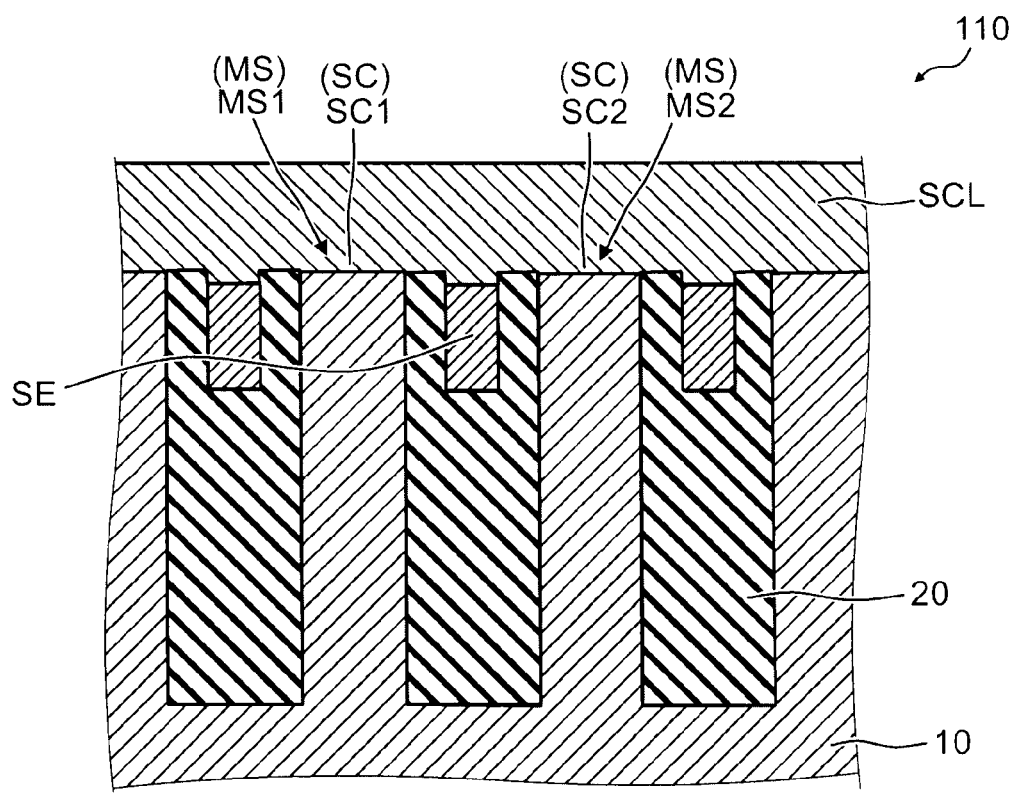
FIG. 3 is a schematic cross-sectional view illustrating a configuration of the nonvolatile semiconductor memory device according to the first embodiment.

FIG. 3 is a schematic cross-sectional view illustrating a configuration of the nonvolatile semiconductor memory device according to the first embodiment.

Figure 4:
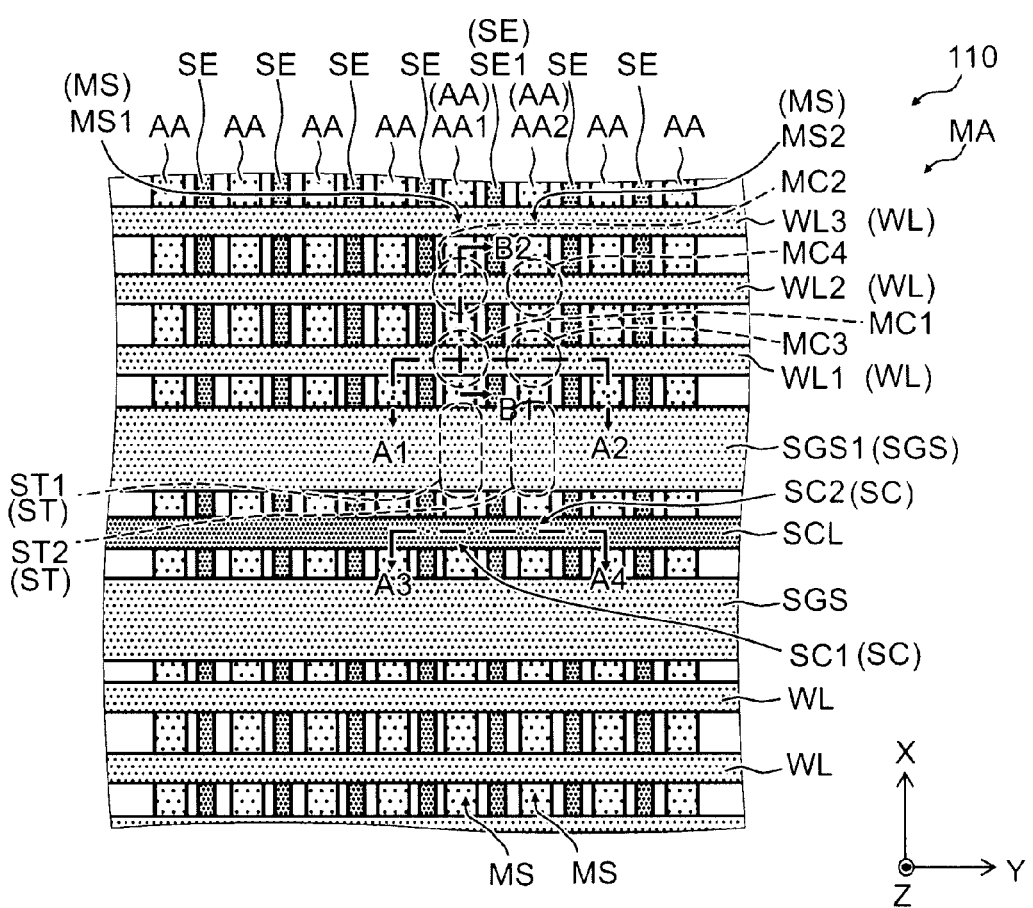
FIG. 4 is a schematic plan view illustrating the nonvolatile semiconductor memory device according to the first embodiment.

FIG. 4 is a schematic plan view illustrating the nonvolatile semiconductor memory device according to the first embodiment.

FIG. 1 is a cross-section through A1-A2 in FIG. 4. FIG. 2 is a cross-section through B1-B2 in FIG. 4. FIG. 3 is a cross-section through A3-A4 in FIG. 4. FIG. 4 is a see-thorough plan view from which insulating portions have been omitted for simplification when viewing.

As illustrated in FIG. 4, a nonvolatile semiconductor memory device 110 according to this embodiment includes a first memory string MS1, a first source contact SC1 (source contact SC), a second memory string MS2, and a shield conductive layer SE.

The first memory string MS1 includes a first memory cell MC1 and a second memory cell MC2 aligned along a first axis (X-axis).

The first source contact SC1 is provided at a source-side end of the first memory string MS1.

The second memory string MS2 extends along the first axis. The second memory string MS2 includes a third memory cell MC3. The third memory cell MC3 is aligned with the first memory cell MC1 along a second axis (Y-axis) that is perpendicular to the first axis. The second memory string MS2 is aligned with the third memory cell MC3 along the first axis, and further includes a fourth memory cell MC4 that is aligned with the second memory cell MC2 along the second axis.

The nonvolatile semiconductor memory device 110 can further include a second source contact SC2 provided at a source-side end of the second memory string MS2.

Here, the axis perpendicular to the first axis (X-axis) and the second axis (Y-axis) is a third axis (Z-axis).

The shield conductive layer SE extends along the first axis between the first memory string MS1 and the second memory string MS2. The shield conductive layer SE is electrically connected to a source contact line SCL.

The shield conductive layer SE may contain one or more of, for example, tungsten, polysilicon (polycrystalline silicon), and silicide.

The above-described first memory string MS1, first source contact SC1, second memory string MS2, second source contact SC2, and shield conductive layer SE are provided in a memory cell array MA.

According to the nonvolatile semiconductor memory device 110, capacitive coupling between the adjacent memory cells MC (the first memory cell MC1 and the third memory cell MC3 in this example) is suppressed. Consequently, the interference between adjacent cells can be suppressed.

Specifically, the nonvolatile semiconductor memory device 110 includes: the first memory string MS1 including a plurality of memory cells MC connected in series along the X-axis; the source contact SC (first source contact SC1) provided at a source-side end of the first memory string MS1; the second memory string MS2 aligned with the first memory string MS1 along the Y-axis that is perpendicular to the X-axis and including a plurality of memory cells MC connected in series along the X-axis; and the shield conductive layer SE that extends along the X-axis between the first memory string MS1 and the second memory string MS2 and is electrically connected to the source contact line SCL.

The nonvolatile semiconductor memory device 110 includes a plurality of memory strings MS. The number of memory strings may be freely set but must be at least 2. The plurality of memory strings MS includes, for example, the first memory string MS1 and the second memory string MS2.

Each of the plurality of memory strings MS includes a plurality of memory cells MC connected in series along the X-axis. The number of memory cells included in a single memory string MS may be freely set but must be at least 2.

As described later, the plurality of memory cells MC included in a single memory string MS includes semiconductor layers that extend along the X-axis and form a portion of an active area AA. For example, the first memory string MS1 is provided on a first active area AA1. The second memory string MS2 is provided on a second active area AA2. Each of the plurality of active areas AA extends along the X-axis.

In the nonvolatile semiconductor memory device 110, a plurality of word lines WL (for example, first to third word lines WL1 to WL3) is provided. Each of the plurality of word lines WL extends in the Y-axis direction. At each of intersections between the active area AA and the word lines WL, a memory cell MC is provided.

For example, selection gate lines may be provided at both ends of the plurality of memory strings MS. Specifically, at the source-side end of the memory strings MS, a source-side selection gate line SGS extending along the Y-axis is provided. At the drain-side (not shown in the drawings) end of the memory string, a drain-side selection gate line (not shown in the drawings) extending along the Y-axis is provided.

At portions where the active area AA and the selection gate lines intersect, selection gate transistors are provided. Specifically, at the portions where active areas AA and source-side selection gate lines SGS intersect, source-side selection transistors ST are provided. At the portions where the active area AA and the drain-side selection gate lines (not shown in the drawings) intersect, drain-side selection transistors (not shown in the drawings) are provided.

Specifically, at a portion where the first active area AA1 and a first source-side selection gate line SGS1 intersect, a first source side selection transistor ST1 is provided. At a portion where the second active area AA2 and the first source-side selection gate line SGS1 intersect, a second source-side selection transistor ST2 is provided.

In the first memory string MS1, the first source-side selection transistor ST1 is arranged between the plurality of memory cells MC and the first source contact SC1 (source contact SC). In the second memory string MS2, the second source-side selection transistor ST2 is arranged between the plurality of memory cells MC and the second source contact SC2 (source contact SC). The source contacts SC are, for example, electrically connected to a source-side diffusion region of the source-side selection transistor ST.

Thus, the first memory string MS1 further includes a first source-side selection transistor ST1 provided between the first memory cell MC1 and second memory cell MC2, and the first source contact SC1. The first source contact SC1 is electrically connected to the source diffusion region (source region) of the first source-side selection transistor ST1.

As illustrated in FIG. 4, in this embodiment, a plurality of memory strings MS extending along the X-axis is provided at both X-axis sides of the single source contact line SCL extending along the Y-axis.

As illustrated in FIG. 1, the first memory cell MC1 includes a first channel portion CR1, a first gate electrode GE1, and a first memory portion MP1. The first gate electrode GE1 opposes the first channel portion CR1. The first memory portion MP1 is provided between the first channel portion CR1 and the first gate electrode GE1. The first memory portion MP1 includes a first charge storage layer CL1.

In this embodiment, the first memory portion MP1 further includes a first tunnel insulating film TI1 and a first block insulating film BI1. The first tunnel insulating film TI1 is provided between the first channel portion CR1 and the first charge storage layer CL1. The first block insulating film BI1 is provided between the first charge storage layer CL1 and the first gate electrode GE1.

The third memory cell MC3 includes a third channel portion CR3, a third gate electrode GE3 and a third memory portion MP3. The third gate electrode GE3 opposes the third channel portion CR3. The third memory portion MP3 is provided between the third channel portion CR3 and the third gate electrode GE3. The third memory portion MP3 includes a third charge storage layer CL3.

In this embodiment, the third memory portion MP3 further includes a third tunnel insulating film TI3 and a third block insulating film BI3. The third tunnel insulating film TI3 is provided between the third channel portion CR3 and the third charge storage layer CL3. The third block insulating film BI3 is provided between the third charge storage layer CL3 and the third gate electrode GE3.

Thus, the plurality of memory cells MC each includes a channel portion CR, a gate electrode GE and a memory portion MP. The gate electrode GE opposes the channel portion CR. The memory portion MP is provided between the channel portion CR and the gate electrode GE. The memory portion MP includes a charge storage layer CL. The memory portion MP further includes a tunnel insulating film TI and a block insulating film BI. The tunnel insulating film TI is provided between the channel portion CR and the charge storage layer CL. The block insulating film BI is provided between the charge storage layer CL and the gate electrode GE.

Also, in this embodiment, the charge storage layers CL (first charge storage layer CL1 and second charge storage layer CL2) are conductors. For the charge storage layer CL, polysilicon may, for example, be used. Thus, the nonvolatile semiconductor memory device 110 is a floating-gate nonvolatile semiconductor memory device.

The first gate electrode GE1 is electrically connected to the third gate electrode GE3. The first gate electrode GE1 and the third gate electrode GE3 are, for example, parts of the word line WL that extends along the Y-axis.

The nonvolatile semiconductor memory device 110 further includes a first side-face gate electrode SFE1 (side-face gate electrode SFE), a first side-face insulating film SI1, and a third side-face insulating film SI3.

The first side-face gate electrode SFE1 is electrically connected to the first gate electrode GE1 and the third gate electrode GE3. The first side-face gate electrode SFE1 is provided between at least a portion of a side face of the first charge storage layer CL1 and at least a portion of a side face of the third charge storage layer CL3. Specifically, the first side-face gate electrode SFE1 extends between the side face of the first charge storage layer CL1 and the side face of the third charge storage layer CL3.

The first side-face insulating film SI1 is provided between the first side-face gate electrode SFE1 and at least a portion of the side face of the first charge storage layer CL1. A third side-face insulating film SI3 is provided between the first side-face gate electrode SFE1 and at least a portion of the side face of the third charge storage layer CL3.

Thus, the gate electrode is provided so as to oppose the top surface and a portion of the side face of the charge storage layer CL.

The nonvolatile semiconductor memory device 110 may further include, for example, a semiconductor base layer (semiconductor substrate 10). The above-described first memory string MS1, first source contact SC1, second memory string MS2, second source contact SC2, and shield conductive layer SE are provided on the semiconductor base layer. In other words, a device isolating insulating film 20 (Shallow Trench Isolation) is provided on a major surface of the semiconductor substrate 10. The device isolating insulating film 20 acts to separate the plurality of memory strings MS.

In the nonvolatile semiconductor memory device 110, a top surface SET of the shield conductive layer SE is positioned lower than a top surface CR1T of the first channel portion CR1. Specifically, the top surface CR1T of the first channel portion CR1 has a height between those of a bottom surface GE1B of the first gate electrode GE1 and the top surface SET of the shield conductive layer SE.

In other words, a plane that is perpendicular to the Z-axis and passes through a first gate electrode GE1-side surface of the first channel portion CR1 (top surface CR1T) is arranged between a plane that is perpendicular to the Z-axis and passes through a first channel portion CR1-side surface of the first gate electrode GE1 (bottom surface GE1B) and a plane that is perpendicular to the Z-axis and passes through the Z-axis first gate electrode GE1-side surface of the shield conductive layer SE (top surface SET).

Specifically, a distance along the Z-axis between the shield conductive layer SE and the first gate electrode GE1 is greater than a distance along the Z-axis between the first channel portion CR1 and the first gate electrode GE1.

Similarly, a plane that is perpendicular to the Z-axis and passes through a third gate electrode GE3-side surface of the third channel portion CR3 is arranged between a plane that is perpendicular to the Z-axis and passes through a third channel portion CR3-side surface of the third gate electrode GE3 and a plane that is perpendicular to the Z-axis and passes through the Z-axis third gate electrode GE3-side surface of the shield conductive layer SE.

By positioning the top surface SET of the shield conductive layer SE lower than the top surface CR1T of the first channel portion CR1 and lower than the top surface of the third channel portion CR3 in this way, the shielding effect can be improved. Consequently, interference between adjacent cells can be effectively suppressed.

As illustrated in FIG. 2, the second memory cell MC2 includes a second channel portion CR2, a second gate electrode GE2 and a second memory portion MP2. The second gate electrode GE2 opposes the second channel portion CR2. The second memory portion MP2 is provided between the second channel portion CR2 and the second gate electrode GE2. The second memory portion MP2 includes a second charge storage layer CL2.

The second memory portion MP2 further includes a second tunnel insulating film TI2 and a second block insulating film BI2. The second tunnel insulating film TI2 is provided between the second channel portion CR2 and the second charge storage layer CL2. The second block insulating film BI2 is provided between the second charge storage layer CL2 and the second gate electrode GE2.

As illustrated in FIG. 2, the first memory string MS1 further includes a first diffusion region DR1 (first source/drain region), a second diffusion region DR2 (second source/drain region) and a third diffusion region DR3 (third source/drain region), which are aligned along the X-axis. The second diffusion region DR2 is arranged between the first diffusion region DR1 and the third diffusion region DR3. In this way, the first memory string can contain a plurality of diffusion regions DR. The memory cells MC are disposed in the gaps between the plurality of diffusion regions DR.

Specifically, the first channel portion CR1 of the first memory cell MC1 is disposed between the first diffusion region DR1 and the second diffusion region DR2. The second channel portion CR2 of the second memory cell MC2 is disposed between the second diffusion region DR2 and the third diffusion region DR3.

Thus, the diffusion regions DR are shared by pairs of memory cells aligned along the X-axis. Note there is no particular requirement to provide the diffusion regions DR. It is sufficient that the memory strings MS can be formed.

Between the plurality of memory cells MC (the first memory cell MC1 and the second memory cell MC2, for instance), an inter-layer insulation film 30 is provided.

The configuration of a third memory cell MC3 and a fourth memory cell MC4 is the same as the configuration of the first memory cell MC1 and the second memory cell MC2 illustrated in FIG. 2 and has therefore been omitted from the drawings.

The fourth memory cell includes a fourth channel portion (not shown in the drawings), a fourth gate electrode (not shown in the drawings) and a fourth memory portion (not shown in the drawings). The fourth gate electrode opposes the fourth channel portion. The fourth memory portion is provided between the fourth channel portion and the fourth gate electrode. The fourth memory portion includes a fourth charge storage layer.

The nonvolatile semiconductor memory device 110 may further include a second side-face gate electrode (not shown in the drawings), a second side-face insulating film (not shown in the drawings), and a fourth side-face insulating film (not shown in the drawings). The second side-face gate electrode is electrically connected to the second gate electrode GE2 and the fourth gate electrode and is provided between at least a portion of a side face of the second charge storage layer CL2 and at least a portion of a side face of the fourth charge storage layer. The second side-face insulating film is provided between the second side-face gate electrode and at least a portion of the side face of the second charge storage layer CL2. The fourth side-face insulating film is provided between the second side-face gate electrode and at least a portion of the side face of the fourth charge storage layer.

The second memory string MS2 further includes a fourth diffusion region, a fifth diffusion region and a sixth diffusion region, which are aligned along the X-axis and not shown in the drawings. The fifth diffusion region is arranged between the fourth diffusion region and the sixth diffusion region. The third channel portion CR3 of the third memory cell MC3 is arranged between the fourth diffusion region and the fifth diffusion region. The fourth channel portion of the fourth memory cell MC4 is provided between the fifth diffusion region and the sixth diffusion region.

As illustrated in FIG. 3, a source contact line SCL extending along the Y-axis is provided at the end (source-side end) of the memory string MS. Hence, the shield conductive layer SE is electrically connected to the source contact SC.

Specifically, at the end (source-side end) of the first memory string MS1, the shield conductive layer SE is electrically connected to the first source contact SC1. The shield conductive layer SE is also electrically connected to the second source contact SC2.

Figure 5:
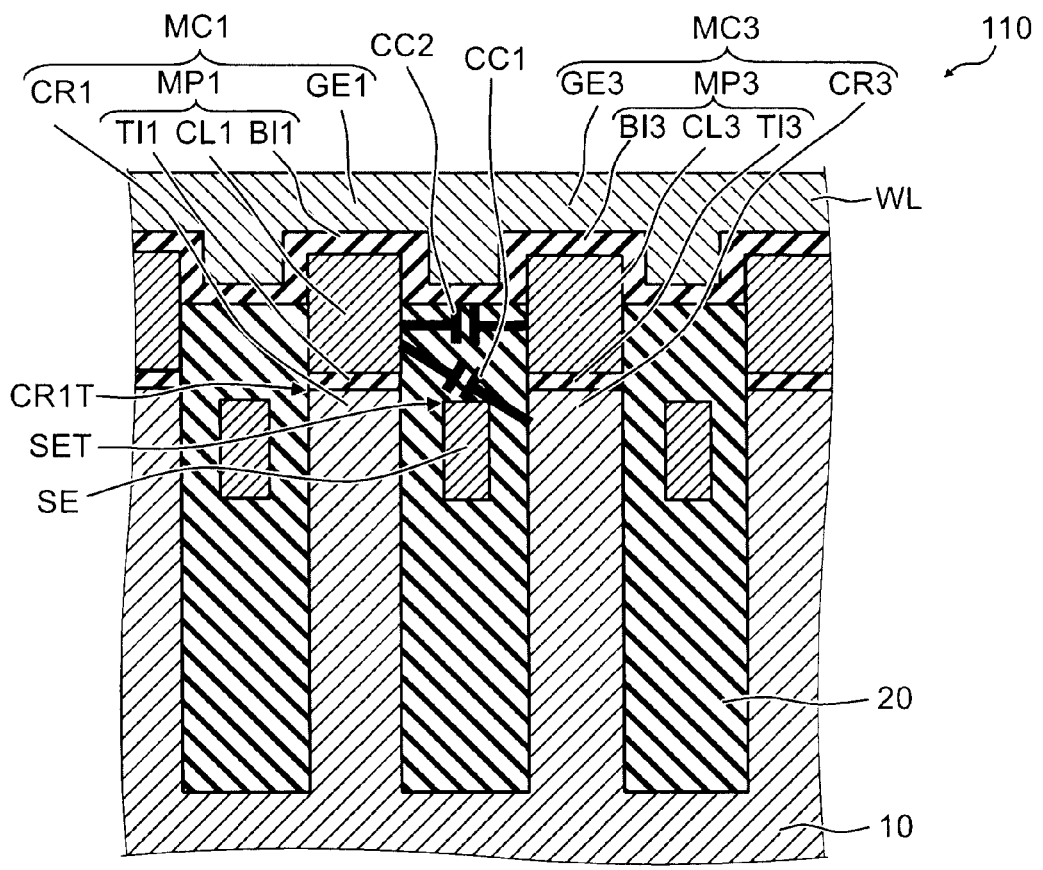
FIG. 5 is a schematic view for illustrating operations of the nonvolatile semiconductor memory device.

FIG. 5 is a schematic view for illustrating operations of the nonvolatile semiconductor memory device.

Specifically, FIG. 5 is a schematic view of a cross-section through A1-A2 in FIG. 4.

For example, suppose that the third memory cell MC3 in FIG. 5 is a cell to which writing has finished. Suppose also that a writing operation is being performed on the first memory cell MC1. In other words, the first memory cell MC1 is a cell selected for a writing operation.

Note the operation of writing to the first memory cell MC1 is an operation in which electrons are charged into the first charge storage layer CL1 and/or holes are discharged from the first charge storage layer CL1. The charge of electrons into the first charge storage layer CL1 is performed by, for example, charging electrons into the first charge storage layer CL1 from the first channel portion CR1.

When operation of writing to the first memory cell MC1 has been implemented, the third memory cell MC3 is in an unselected state. At this time, in Reference Example 1 in which the shield conductive layer SE is not provided, the third memory cell MC3 is in a boost potential state. In the Reference Example 1, capacitive coupling CC1 occurs between the first memory cell MC1 and the semiconductor substrate 10 that corresponds to the third memory cell MC3 (third channel portion CR3). Hence, the first memory cell MC1 is affected by the third memory cell MC3 via the capacitive coupling CC1. As a result, the writing of the first memory cell MC1 to a desired state is obstructed.

By contrast, in the nonvolatile semiconductor memory device 110 according to this embodiment, the capacitive coupling CC1 is suppressed as a result of providing the shield conductive layer SE. Thus, interference between adjacent cells is suppressed. Accordingly, the desired memory cell MC can be stably written to the desired state.

As illustrated in FIG. 5, the capacitive coupling CC1 occurs along a direction inclined with respect to the Z-axis, between the first memory cell MC1 and the semiconductor substrate 10 that corresponds to the third memory cell MC3 (third channel portion CR3). As described above, in the nonvolatile semiconductor memory device 110, a top surface SET of the shield conductive layer SE is positioned lower than a top surface CR1T of the first channel portion CR1. Accordingly, the capacitive coupling CC1 along the direction inclined with respect to the Z-axis is suppressed more effectively.

Further, the shield conductive layer SE has the effect of suppressing a capacitive coupling CC2 between the first charge storage layer CL1 of the first memory cell MC1 and the third charge storage layer CL3 of the third memory cell MC3. Accordingly, interference between adjacent cells is further suppressed.

It is preferable to apply an intermediate voltage to the shield conductive layer SE. Thus, during the writing operation, a writing voltage is applied to the first gate electrode GE1 with reference to the potential of the semiconductor base layer (semiconductor substrate 10). Here, when the semiconductor base layer (semiconductor substrate 10) is referenced, it is preferable that a voltage (intermediate voltage) lower than the writing voltage is applied to the shield conductive layer SE. It is then possible to suppress writing errors which occur due to insufficient boosting of the third memory cell MC3 when writing has finished.

The writing voltage is, for example, approximately 20 to 25V. It is estimated that a voltage of approximately 6V is applied to the floating gate (charge storage layer CL). At this point, it is preferable that a voltage of not less than 2V and not more than 3V is applied to the shield conductive layer SE.

Thus, it is preferable that the above-described intermediate voltage is higher than the potential of the semiconductor base layer but not more than ¼ of the writing voltage.

Reference Example 2 in which the shield conductive layer SE is electrically connected to the semiconductor substrate 10 may also be considered. In Reference Example 2, the potential of the shield conductive layer SE is fixed at the potential of the semiconductor substrate 10. Hence, the potential of the shield conductive layer SE cannot be appropriately adjusted.

For instance, it is not possible to apply an intermediate voltage of the type described above to the shield conductive layer SE.

By contrast, in the nonvolatile semiconductor memory device 110 according to this embodiment, the shield conductive layer SE is connected to the source contact SC, and so the potential of the shield conductive layer SE can be set to potential different to that of the semiconductor substrate 10. Thus, in this embodiment, interference between adjacent cells can be suppressed more effectively through use of appropriate potentials.

Further, Reference Example 3 in which an ONO film (a stacked film of silicon oxide film, silicon nitride film and silicon oxide film) included, for example, in the memory portion MP is caused to contact the semiconductor substrate 10 may be considered. With this configuration, it may be possible to obtain a shielding effect. However, it is considered that charges resulting form writing and deleting will build up in the ONO film, and that this may lead to a degradation in the data storage characteristics.

By contrast, in the nonvolatile semiconductor memory device 110 according to this embodiment, an ONO film that is, for example, included in the memory portion MP is electrically isolated from the semiconductor substrate 10 or the like. Hence, the data storage characteristics are favorable. Thus, according to this embodiment, it is possible to suppress interference between adjacent cells while also suppressing adverse effects on other operating characteristics.

Second Embodiment

This embodiment is a manufacturing method of the nonvolatile semiconductor memory device 110 according to the first embodiment.

Figure 6:
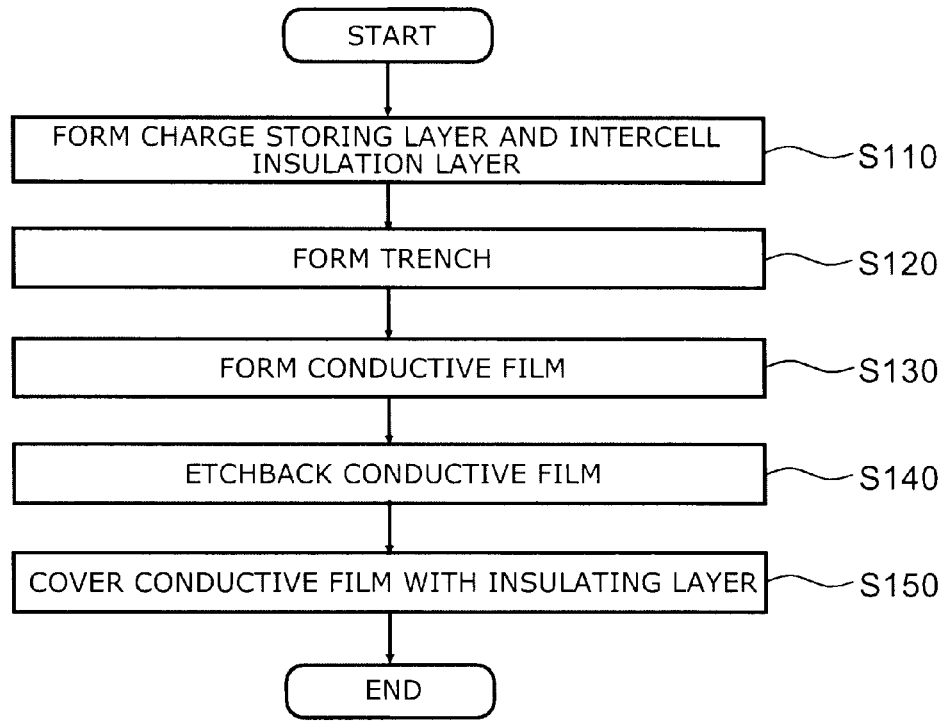
FIG. 6 is a flowchart illustrating a manufacturing method of a nonvolatile semiconductor memory device according to a second embodiment.

FIG. 6 is a flowchart illustrating a manufacturing method of a nonvolatile semiconductor memory device according to the second embodiment.

Figure 7A:
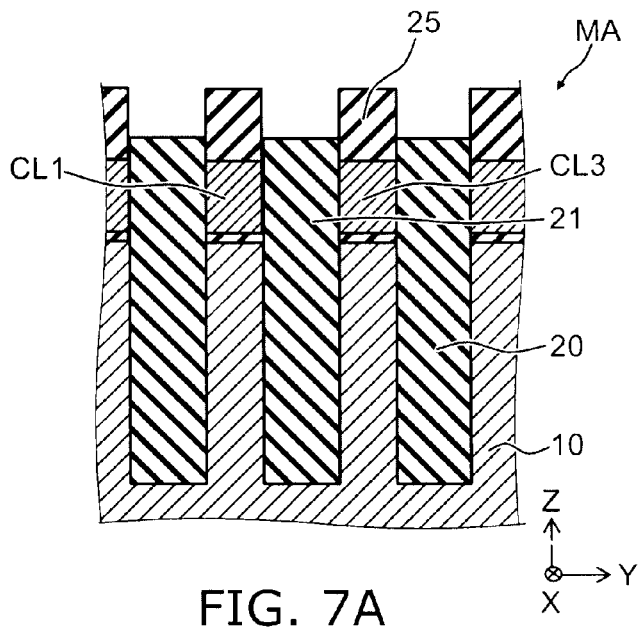
FIG. 7A and FIG. 7B are procedural schematic cross-sectional views illustrating the manufacturing method of the nonvolatile semiconductor memory device according to the second embodiment.
Figure 7B:
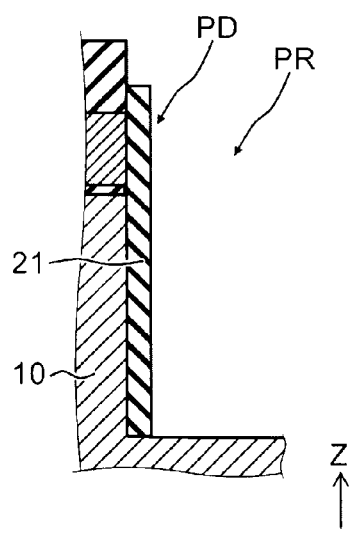

FIG. 7A and FIG. 7B are procedural schematic cross-sectional views illustrating the manufacturing method of the nonvolatile semiconductor memory device according to the second embodiment.

FIG. 8A and FIG. 8B are procedural schematic cross-sectional views illustrating the manufacturing method of the nonvolatile semiconductor memory device according to the second embodiment.

FIG. 9A and FIG. 9B are procedural schematic cross-sectional views illustrating the manufacturing method of the nonvolatile semiconductor memory device according to the second embodiment.

Figure 10A:
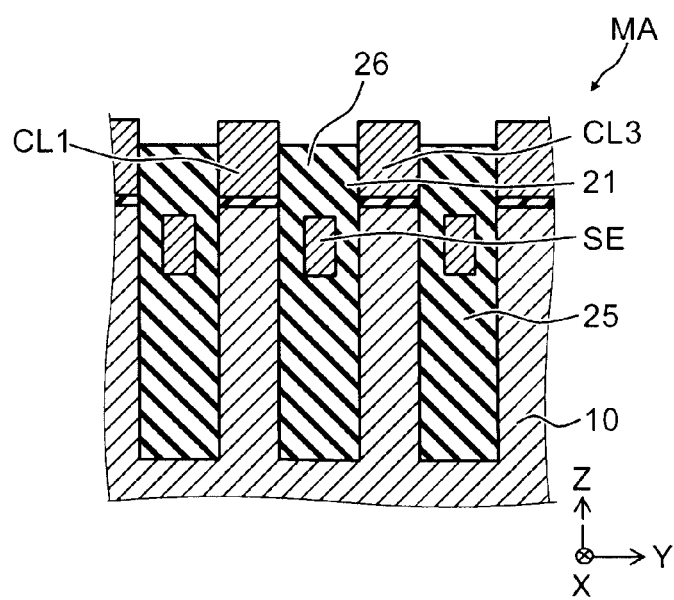
FIG. 10A and FIG. 10B are procedural schematic cross-sectional views illustrating the manufacturing method of the nonvolatile semiconductor memory device according to the second embodiment.
Figure 10B:
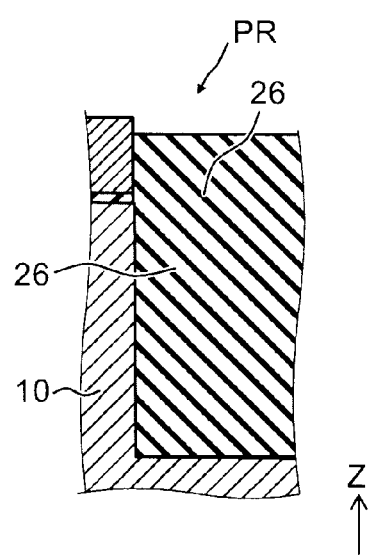

FIG. 10A and FIG. 10B are procedural schematic cross-sectional views illustrating the manufacturing method of the nonvolatile semiconductor memory device according to the second embodiment.

The manufacturing method is one for the nonvolatile semiconductor memory device 110 that includes the memory cell array MA and a peripheral portion aligned with the memory cell array MA. The memory cell array MA includes the first memory string MS1, the source contact SC (such as the first source contact), the second memory string MS2 and the shield conductive layer SE. The configuration of these elements has already been described and further descriptions are therefore omitted from the following. The peripheral portion includes a recess portion of greater width than the gap between the first memory cell MC1 and the third memory cell MC3.

FIGS. 7A, 8A, 9A and 10A are partial cross-sectional views of the memory cell array MA. FIGS. 7B, 8B, 9B and 10B are partial cross-sectional views of the peripheral portion.

As illustrated in FIGS. 6 and 7A, the first charge storage layer CL1 that is to form a portion of the first memory cell MC1, the third charge storage layer CL3 that is to form a portion of the third memory cell MC3 and an intercell insulation layer 21 between the first charge storage layer CL1 and the third charge storage layer CL3 are formed on a substrate (the semiconductor substrate 10) (Step S110).

Note that in this state, a mask material 25 used when processing the first charge storage layer CL1 and the third charge storage layer CL3 remains. The mask material 25 protects the first charge storage layer CL1 and the third charge storage layer CL3 in the processing described below.

For the first charge storage layer CL1 and the third charge storage layer CL3, polysilicon may, for example, be used. For the intercell insulation layer 21, silicon oxide may, for example, be used.

As illustrated in FIG. 7B, a peripheral portion PR includes a recess portion PD. The recess portion PD has a width greater than that of the gap between the first memory cell MC1 and the third memory cell MC3. Note that here, "width" refers to a length along a direction perpendicular to the Z-axis. The film used in the intercell insulation layer 21 is also used in the recess portion PD.

As illustrated in FIGS. 6, 8A and 8B, a trench 22 is formed in the intercell insulation layer 21 (Step S120). To form the trench 22, anisotropic dry etching may, for example, be used.

Next, a conductive film 23 is formed within the trench 22 and in the recess portion PD (Step S130). For the conductive film 23, polysilicon may, for example, be used. A portion of the conductive film 23 will later form the shield conductive layer SE.

As illustrated in FIGS. 6, 9A and 9B, the conductive film 23 is then etched back (Step S140), the conductive film 23 formed in the recess portion PD being removed while leaving a portion of the conductive film 23 formed within the trench 22.

As described above, the gap between the first memory cell MC1 and the third memory cell MC3 is narrower than the width of the recess portion PD. Thus, a width of the trench 22 is narrower than the width of the recess portion PD. Hence, after removing the conductive film 23 formed in the recess portion PD, the conductive film 23 can be left within the trench 22. Specifically, without using a mask or the like when performing etchback, the conductive film 23 formed in the recess portion PD can be removed while leaving a portion of the conductive film 23 formed within the trench 22. As a result, the shield conductive layer SE is formed.

As illustrated in FIGS. 6, 10A and 10B, the above-described portion of the conductive film 23 left within the trench 22 is covered by an insulating layer 26 (Step S150). For the insulating layer 26, silicon oxide may, for example, be used.

Thereafter, the nonvolatile semiconductor memory device 110 is formed via required processing, including forming the block insulating film BI and the gate electrode GE, and forming the inter-layer insulation film 30.

In this manufacturing method, the width of the trench 22 is narrower than that of the recess portion PD, and so it is possible to leave the conductive film 23 within the trench 22 even after removing the conductive film 23 formed in the recess portion PD. Hence, without using a mask or the like, the conductive film 23 formed in the recess portion PD can be removed while leaving a portion of the conductive film 23 formed within the trench 22, and a high level of productivity is achieved.

According to this manufacturing method, a nonvolatile semiconductor memory device with suppressed interference between adjacent cells can be manufactured with a high level of productivity.

Third Embodiment

The structural concept of the nonvolatile semiconductor memory device according to this embodiment is similar to that of the nonvolatile semiconductor memory device 110 and so further drawings have been omitted.

In this embodiment, an insulating body of nitride silicon or the like is used as the charge storage layer CL. The nonvolatile semiconductor memory device according to this embodiment has, for example, an MONOS configuration.

Specifically, besides the first charge storage layer CL1, the first memory portion MP1 further includes the first tunnel insulating film TI1 provided between the first channel portion CR1 and the first charge storage layer CL1, and the first block insulating film BI1 provided between the first charge storage layer CL1 and the first gate electrode GE1, the first charge storage layer CL1 being the insulating body.

Further, in the case that the first charge storage layer CL1 is the insulating body, the first block insulating film BI1 may be omitted.

Thus, besides the first charge storage layer CL1 that forms the insulating body, the first memory portion MP1 further includes the first tunnel insulating film TI1 provided between the first channel portion CR1 and the first charge storage layer CL1. The nonvolatile semiconductor memory device may have, for example, an MNOS configuration.

In the nonvolatile semiconductor memory device according to this embodiment having above-described configuration, the interference between adjacent cells can be suppressed.

The nonvolatile semiconductor memory device according to this embodiment can also be manufactured using the manufacturing method described with reference to FIG. 6. Accordingly, a nonvolatile semiconductor memory device with suppressed interference between adjacent cells can be manufactured with a high level of productivity.

According to the embodiments it is possible to provide a nonvolatile semiconductor memory device with suppressed interference between adjacent cells and a manufacturing method for the same.

Embodiments of the invention with reference to examples were described above. However, the present invention is not limited to these examples. The specific configuration of memory strings, source contacts, shield conductive layers, memory cells, channel portions, charge storage layers, gate electrodes, tunnel insulating films, block insulating films, diffusion regions, control gate lines, and control gate transistors included in the nonvolatile semiconductor memory device not limiting. Where a person skilled in the art selects the specific configurations of such elements from well-known technologies and implements the invention in a similar manner, provided that similar effects are achieved, the result shall be understood to be included within the scope of this invention.

In addition, all nonvolatile semiconductor memory devices and manufacturing methods for the same which are based on the nonvolatile semiconductor memory device and manufacturing methods described above as embodiments of this invention, and which can be obtained through appropriate design modifications by a person skilled in the art shall, provided that they not depart from the spirit of the invention, also be understood to fall within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile semiconductor memory device comprising:
   a first memory string including a first memory cell and a second memory cell aligned along a first axis;
   a first source contact provided at a source-side end of the first memory string;
   a second memory string that extends along the first axis and includes a third memory cell that aligns with the first memory cell along a second axis perpendicular to the first axis; and
   a shield conductive layer that extends along the first axis between the first memory string and the second memory string and is electrically connected to the first source contact.

2. The device according to claim 1, wherein the first memory cell includes
   a first channel portion,
   a first gate electrode that opposes the first channel portion, and
   a first memory portion including a first charge storage layer provided between the first channel portion and the first gate electrode, and
   a plane which is perpendicular to a third axis that is perpendicular to the first axis and the second axis and which passes through a first gate electrode-side surface of the first channel portion is arranged between
   a plane which is perpendicular to the third axis and passes through a first channel portion-side surface of the first gate electrode and
   a plane which is perpendicular to the third axis and passes through, with respect to the third axis, a first gate electrode-side surface of the shield conductive layer.

3. The device according to claim 1, wherein the third memory cell includes
   a third channel portion,
   a third gate electrode that opposes the third channel portion and
   a third memory portion including a third charge storage layer provided between the third channel portion and the third gate electrode, the device further comprising:
   a side-face gate electrode that is electrically connected to the first gate electrode and the third gate electrode and provided between at least a portion of a side face of the first charge storage layer and at least a portion of a side face of the third charge storage layer;
   a first side-face insulating film provided between the side-face gate electrode and at least a portion of the side face of the first charge storage layer; and
   a third side-face insulating film provided between the side-face gate electrode and at least a portion of the side face of the third charge storage layer.

4. The device according to claim 2, further comprising a semiconductor base layer, wherein
the first memory string, the first source contact, the second memory string, a second source contact and the shield conductive layer are provided on the semiconductor base layer,
when a writing operation is being performed by at least one of charging electrons into the first charge storage layer and discharging holes from the first charge storage layer, a writing voltage based on a potential of the semiconductor base layer is applied to the first gate electrode and an intermediate voltage that is lower than the writing voltage when based on the semiconductor base layer is applied to the shield conductive layer,
wherein the second source contact provided at a source-side end of the second memory string.

5. The device according to claim 4, wherein the intermediate voltage is higher than the potential of the semiconductor base layer but not more than ¼ of the writing voltage.

6. The device according to claim 4, wherein the writing voltage is not less than 20 volts and not more than 25 volts and the intermediate voltage is not less than 2 volts and not more than 3 volts.

7. The device according to claim 1, wherein the shield conductive layer includes at least one of tungsten, polysilicon and silicide.

8. The device according to claim 1, wherein the first memory string further includes a first source-side selection transistor provided between the first memory cell and second memory cell and the first source contact, and
the first source contact is electrically connected to a source region of the first source-side selection transistor.

9. The device according to claim 1, wherein: the first memory string further includes a first source drain region, a second source drain region and a third source drain region aligned along the first axis, the second source drain region being disposed between the first source drain region and the third source drain region;
the first memory cell includes
a first channel portion provided between the first source drain region and the second source drain region,
a first gate electrode that opposes the first channel portion, and
a first memory portion including a first charge storage layer provided between the first channel portion and the first gate electrode; and
the second memory cell includes
a second channel portion provided between the second source region and a source drain diffusion region,
a second gate electrode that opposes the second channel portion, and
a second memory portion that includes a second charge storage layer provided between the second channel portion and the second gate electrode.

10. The device according to claim 9, wherein the first memory portion further includes
a first tunnel insulating film provided between the first channel portion and the first charge storage layer, and
a first block insulating film provided between the second charge storage layer and the first gate electrode.

11. The device according to claim 2, wherein the first memory portion further includes
a first tunnel insulating film provided between the first channel portion and the first charge storage layer, and
a first block insulating film provided between the first charge storage layer and the first gate electrode, and
the first charge storage layer is a conductive body.

12. The device according to claim 2, wherein the first charge storage layer includes polysilicon.

13. The device according to claim 9, wherein the first memory portion further includes
a first tunnel insulating film provided between the first channel portion and the first charge storage layer, and
a first block insulating film provided between the second charge storage layer and the first gate electrode, and
the first charge storage layer is an insulating body.

14. The device according to claim 13, wherein the first charge storage layer includes silicon nitride.

15. The device according to claim 2, wherein the first memory portion further includes
a first tunnel insulating film provided between the first channel portion and the first charge storage layer, and
the first charge storage layer is an insulating body.

16. The device according to claim 15, wherein the first charge storage layer includes silicon nitride.

17. The device according to claim 1, further comprising a second source contact provided at a source-side end of the second memory string, wherein
the shield conductive layer is further electrically connected to the second source contact.

18. The device according to claim 2, wherein the third memory cell includes
a third channel portion
a third gate electrode that opposes the third channel portion, and
a third memory portion including a third charge storage layer provided between the third channel portion and third gate electrode, and
a plane which is perpendicular to the third axis and passes through a third gate electrode-side surface of the third channel portion is arranged between
a plane which is perpendicular to the third axis and passes through a third channel portion-side surface of the third gate electrode and
a plane which is perpendicular to the third axis and passes through, with respect to the third axis, a third gate electrode-side surface of the shield conductive layer.

19. The device according to claim 1, wherein the second memory string further includes
a fourth memory cell that aligns with the third memory cell along the first axis and aligns with the second memory cell along the second axis.

* * * * *